(12) United States Patent
Hartig

(10) Patent No.: US 7,192,647 B2
(45) Date of Patent: Mar. 20, 2007

(54) CONCENTRATION-MODULATED COATINGS

(75) Inventor: Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 350 days.

(21) Appl. No.: 10/876,254

(22) Filed: Jun. 24, 2004

(65) Prior Publication Data

US 2005/0026002 A1 Feb. 3, 2005

Related U.S. Application Data

(60) Provisional application No. 60/482,128, filed on Jun. 24, 2003.

(51) Int. Cl.
*B32B 17/06* (2006.01)
(52) U.S. Cl. .............. 428/432; 428/698; 428/699; 428/701; 428/702
(58) Field of Classification Search ........ 428/428, 428/432, 697, 698, 699, 701, 702, 704
See application file for complete search history.

(56) References Cited

U.S. PATENT DOCUMENTS

| | | | |
|---|---|---|---|
| 3,985,635 A | 10/1976 | Adam et al. ............ 204/298 |
| 4,322,276 A | 3/1982 | Meckel et al. .......... 204/192 |
| 4,465,575 A | 8/1984 | Love et al. ............ 204/192 |
| 4,790,922 A | 12/1988 | Huffer ................. 204/192.27 |
| 4,798,660 A | 1/1989 | Ermer et al. ........ 204/192.17 |
| 4,814,056 A | 3/1989 | Welty ................. 204/298 |
| 5,356,718 A | 10/1994 | Athey ................. 428/428 |
| 5,427,665 A | 6/1995 | Hartig et al. ......... 204/192.12 |
| 5,439,575 A | 8/1995 | Thornton et al. .... 204/192.25 |
| 5,464,657 A | 11/1995 | Athey et al. .......... 427/255.5 |
| 5,580,667 A | 12/1996 | Shinohara et al. |
| 5,780,149 A | 7/1998 | McCurdy et al. ........ 428/336 |
| 5,811,191 A | 9/1998 | Neuman .............. 428/427 |
| 5,939,201 A | 8/1999 | Joret et al. |
| 6,048,442 A | 4/2000 | Kushiya et al. ....... 204/192.28 |
| 6,092,669 A | 7/2000 | Kushiya et al. ....... 209/298.26 |
| 6,165,598 A | 12/2000 | Nelson ................ 428/212 |
| 6,174,599 B1 | 1/2001 | Boire et al. .......... 428/336 |
| 6,354,109 B1 | 3/2002 | Boire et al. .......... 65/60.1 |
| 2002/0033331 A1 | 3/2002 | Nakayama |
| 2002/0102352 A1* | 8/2002 | Hartig et al. .......... 427/165 |
| 2003/0165693 A1* | 9/2003 | Hartig et al. .......... 428/426 |

FOREIGN PATENT DOCUMENTS

| | | |
|---|---|---|
| DE | 100 42 194 A | 9/2002 |
| EP | 0 567 735 A | 11/1993 |
| EP | 0 646 551 A | 4/1995 |
| EP | 0 796 825 A | 9/1997 |
| EP | 1 123 906 A | 8/2001 |
| GB | 2126256 | 8/1983 |
| GB | 2 126 256 A | 3/1984 |
| WO | WO 00/37376 A | 6/2000 |

\* cited by examiner

*Primary Examiner*—Jennifer McNeil
*Assistant Examiner*—G. Blackwell
(74) *Attorney, Agent, or Firm*—Fredrikson & Byron, P.A.

(57) ABSTRACT

The invention provides a substrate bearing a low-emissivity coating. The low-emissivity coating comprises at least one graded film region. In certain embodiments, at least one graded film region is provided between the two infrared-reflective layers of a double-type low-emissivity coating. The graded film region has a substantially continuously decreasing concentration of a first dielectric material and a substantially continuously increasing concentration of a second dielectric material. Also provided are methods of depositing such low-emissivity coatings and substrates bearing these coatings.

39 Claims, 5 Drawing Sheets

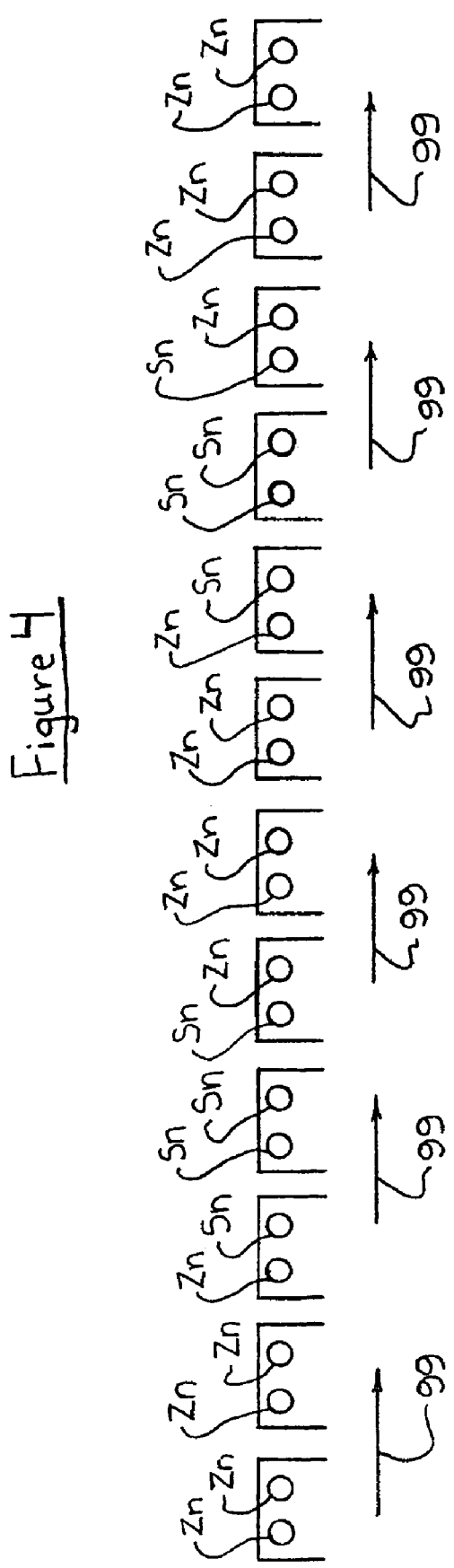

CONCENTRATION-MODULATED COATINGS

CROSS REFERENCE TO RELATED APPLICATION

The present application claims priority to provisional U.S. patent application filed Jun. 24, 2003 and assigned Ser. No. 60/482,128, the entire disclosure of which is incorporated herein by reference.

FIELD OF THE INVENTION

The present invention provides coatings for glass and other substrates. More particularly, this invention provides low-emissivity coatings. Also provided are methods of depositing low-emissivity coatings and substrates bearing these coatings.

BACKGROUND OF THE INVENTION

Low-emissivity coatings are well known in the present art. Typically, they include one or more infrared-reflective layers each positioned between two or more dielectric layers. The infrared-reflective layers reduce the transmission of radiant heat through the coating. The infrared-reflective layers typically comprise electrically-conductive metals, such as silver, gold, or copper. The dielectric layers reduce the visible reflectance of the coating and control other coating properties, such as color. Commonly used dielectrics include oxides of zinc, tin, and titanium, as well as nitrides, such as silicon nitride.

Manufacturers have historically provided a single, thick dielectric layer on each side of each infrared-reflective layer. Reference is made to U.S. Pat. No. 4,859,532, the entire contents of which are incorporated herein by reference. Thick dielectric layers, however, are less than ideal in several respects. For example, the stress in a dielectric layer increases with increasing layer thickness. This is particularly problematic with dielectric films that inherently have high stress, such as silicon nitride. Further, it has been discovered that haze formation is likely to occur in heat-treatable (e.g., temperable) coatings that comprise thick dielectric layers. U.S. patent application Ser. No. 09/728,435, entitled Haze-Resistant Transparent Film Stacks, the entire contents of which are incorporated herein by reference, addresses this problem and replaces thick dielectric layers with a plurality of thin dielectric layers.

Typically, the dielectric layers in a low-emissivity coating are homogenous. That is, each dielectric layer typically has a composition that is uniform over the thickness of the layer. While homogenous dielectric layers have gained widespread acceptance, they have significant limitations. For example, the adhesion properties are limited for a low-emissivity coating wherein all the dielectric layers are homogenous. This is due in part to the discrete interfaces that exist between homogenous dielectric layers. Stress tends to pile up (i.e., be concentrated) at each discrete interface in a low-emissivity coating. Therefore, each such interface is a potential delamination site that is preferably avoided.

Further, the optical opportunities are limited for a low-emissivity coating wherein all the dielectric layers are homogenous. A coating of this nature may only achieve limited color and antireflection properties due to the optical limitations of having each dielectric layer in the coating be homogenous.

As noted above, the primary optical function of the dielectric films in a low-emissivity coating is to antireflect the infrared-reflective film (e.g., silver) in the coating. The dielectric films, however, desirably provide additional functions. Consider a double-silver coating comprising a dielectric inner coat (between the substrate and the first silver layer), a dielectric middle coat (between the two silver layers), and a dielectric outer coat (further from the substrate than the second silver layer). Each of these coats preferably has specific characteristics, as do the inner and outer interfaces of each coat.

Insofar as the dielectric inner coat is concerned, the inner interface of this coat preferably provides good adhesion to the substrate. It is desirable to assure the base coat adheres well to the substrate, as this coat serves as the foundation for the coating. In some cases, it is also desirable that the outer interface of the inner coat provide good growth conditions for silver film. The electrical conductivity (and hence the emissivity) of a silver film varies depending upon the particular surface on which the silver is deposited. Thus, when a silver film is provided directly over the dielectric inner coat, the inner coat desirably has an outer interface that provides a good nucleation surface on which to grow silver film. In such cases, this outer interface preferably also adheres well to the overlying silver film. Further, the outer interface in such cases preferably immobilizes the overlying silver as much as possible (particularly during heat treatment). It is to be appreciated that in some cases a metal blocker film or another non-dielectric film is alternatively placed beneath a silver film to achieved desired durability and/or optical and/or insulating properties. The dielectric inner coat preferably prevents sodium ions and other material from diffusing out of a glass substrate (i.e., it preferably seals the glass). This is desirable to protect the first silver layer against being corroded from below.

Unfortunately, it is difficult to optimize all these properties using an inner coat formed by a single layer of any one material. As an alternative, the inner coat can be formed of two or more discrete layers of different materials, each chosen to optimize one or more of the desired coating properties. However, this leaves the inner coat with an additional interface which, as noted above, is preferably avoided.

The situation is similar for the dielectric outer coat. For example, the outer coat preferably defines an inner interface that adheres well to the underlying film (e.g., to the second silver layer or the second blocker layer). The outer coat desirably contributes to the mechanical and chemical durability of the coating. For example, the outer coat preferably comprises a chemically durable material. Conjointly, the outer coat preferably defines a smooth outer surface, so as to reduce the coating's vulnerability to being physically abraded. Finally, the outer coat preferably comprises film that prevents moisture, oxygen, and other reactive agents from diffusing to the underlying silver (particularly during heat treatment and over time). This is desirable to protect the second silver layer against being corroded from above. As with the inner coat, it is difficult to optimize all the desired properties with an outer coat formed by a single layer of one material, yet forming the outer coat of two or more discrete layers of different materials yields an additional interface, which is preferably avoided.

With respect to the dielectric middle coat, it is particularly desirable to optimize the properties and functions of the dielectric film used in this coat. This is due in part to the great thickness of the middle coat. (The middle coat is characteristically thicker than the inner and outer coats.) It is particularly desirable, for example, to minimize the stress in the middle coat. This is preferably accomplished by limiting the thickness of each layer in the middle coat. As noted above, the stress in a dielectric layer tends to increase with increasing layer thickness. Thus, by limiting the thickness of each layer in the middle coat (or at least those layers comprising high stress material), stress can be advantageously reduced.

It is also desirable to provide a middle coat that prevents defects from growing over the entire thickness of the middle coat. This can be accomplished by providing a middle coat that comprises a plurality of dielectric layers. In such a middle coat, defects (e.g., pinholes and the like) are less likely to propagate from one layer to another, especially when contiguous layers are formed of different materials. Thus, by providing a middle coat comprising a plurality of dielectric layers, it is less likely that defects will grow across the entire thickness of the middle coat.

Further, it is advantageous to provide a middle coat that is resistant to the haze formation that can occur, e.g., during heat treatment. This can be accomplished by providing a middle coat comprising a plurality of particularly thin dielectric layers, preferably formed of particular materials. While this solution has great benefit, it is less than ideal in that it creates additional interfaces in the middle coat.

Still further, the middle coat preferably defines an inner interface that adheres well to the underlying film (e.g., to the first silver layer or the first blocker layer). Conjointly, in cases where silver is positioned directly over the middle coat, the outer interface of the middle coat preferably provides good growth conditions for the overlying silver layer. In such cases, this outer interface preferably adheres well to the overlying silver film and immobilizes the overlying silver film as much as possible.

It is extremely difficult to optimize all these properties using a middle coat formed by a single layer of any one material. Thus, the middle coat can alternatively be formed by a plurality of discrete layers of different dielectrics, each chosen to optimize one or more properties. This, however, is less than ideal in that it leaves the middle coat with additional interfaces, which are preferably avoided.

It would be desirable to provide a low-emissivity coating that minimizes the foregoing limitations and optimizes the foregoing properties and functions.

SUMMARY OF THE INVENTION

In certain embodiments, the invention provides a substrate bearing a low-emissivity coating. In these embodiments, the low-emissivity coating comprises, in sequence outwardly: a dielectric inner coat; a first infrared-reflective layer (e.g., comprising material that is highly reflective of solar radiation); a concentration-modulated middle coat including a first graded film region having a substantially continuously decreasing concentration of a first dielectric material and a substantially continuously increasing concentration of a second dielectric material, wherein the first and second dielectric materials are different materials; a second infrared-reflective layer (e.g., comprising material that is highly reflective of solar radiation); and a dielectric outer coat.

In certain embodiments, the invention provides a substrate bearing a low-emissivity coating. In these embodiments, the low-emissivity coating comprises, in sequence outwardly: a concentration-modulated inner coat including a first graded film region having a substantially continuously decreasing concentration of tin oxide and a substantially continuously increasing concentration of zinc oxide (or zinc tin oxide), wherein the first graded film region extends from a tin oxide-rich inner area to a zinc oxide-rich (or zinc tin oxide-rich) outer area; a first infrared-reflective layer (e.g., comprising material that is highly reflective of solar radiation); a dielectric middle coat; a second infrared-reflective layer (e.g., comprising material that is highly reflective of solar radiation); and a dielectric outer coat.

In certain embodiments, the invention provides a sputtering line including at least three adjacent sputtering bays each adapted for depositing dielectric film. At least one of these bays is a transition bay equipped with two or more sputtering targets of which at least two carry different sputterable materials. The first target in the transition bay carries the same sputterable material as the last or only target in the preceding (i.e., immediately preceding) bay. The last target in the transition bay carries the same sputterable material as the first or only target in the subsequent (i.e., immediately subsequent) bay.

In certain embodiments, the invention provides a method of producing coated substrates. In these embodiments, the method comprises providing a sputtering line including at least three adjacent sputtering bays each adapted for depositing dielectric film. At least one of these bays is a transition bay equipped with two or more sputtering targets of which at least two carry different sputterable materials. The first target in the transition bay carries the same sputterable material as the last or only target in the preceding bay. The last target in the transition bay carries the same sputterable material as the first or only target in the subsequent bay. The substrate is conveyed through the sputtering line and the targets are sputtered to deposit upon the substrate a coating comprising a graded film region.

In certain embodiments, the invention provides a method of producing coated substrates. In these embodiments, the method comprises depositing a low-emissivity coating upon a substrate, the coating comprising, in sequence outwardly: a dielectric inner coat; a first infrared-reflective layer comprising material that is highly reflective of solar radiation; a concentration-modulated middle coat including a first graded film region having a substantially continuously decreasing concentration of a first dielectric material and a substantially continuously increasing concentration of a second dielectric material, wherein the first and second dielectric materials are different materials; a second infrared-reflective layer comprising material that is highly reflective of solar radiation; and a dielectric outer coat. In some cases, the concentration-modulated middle coat is deposited as film having an index of refraction that is substantially uniform across an entire thickness of the middle coat. For example, the concentration-modulated middle coat can be deposited as film having an index of refraction of between about 1.9 and about 2.2. Preferably, the concentration-modulated middle coat is deposited as film wherein there is no discrete interface between homogenous dielectric layers. In some cases, the concentration-modulated middle coat is deposited as film wherein there is no homogenous film region having a thickness of 200 angstroms or more. Preferably, the first graded film region is deposited as film wherein the concentration of the first dielectric material decreases gradually as the concentration of the second dielectric material increases gradually. In some cases, the first dielectric material is tin oxide and the second dielectric material is zinc oxide, and wherein the first graded film region is deposited so as to extend from a tin oxide-rich inner area to a zinc oxide-rich outer area. In these cases, the tin oxide-rich inner area can be deposited directly over a first blocker layer, and the first blocker layer can be deposited directly over the first infrared-reflective layer. This zinc oxide-rich outer area can be deposited as film comprising at least about 40 angstroms of essentially pure zinc oxide directly beneath the second infrared-reflective layer, and the second infrared-reflective layer can be deposited as film comprising silver. In some cases, the concentration-modulated middle coat is deposited as film comprising, in a contiguous sequence moving outwardly: a first high concentration area, the first high concentration area being rich in the first dielectric material; the first graded film region; a second high concentration area, the second high concentration area being rich in the second dielectric material; a second graded film region having a substantially continuously decreasing concentration of the second dielectric material and a substantially continuously increasing concentration of a third dielectric material, wherein the second and third dielectric materials are different materials; and a third high concentration area, the third high concentration area being rich in the third dielectric material. In these cases, the third dielectric material can be zinc oxide, such that the third high concentration area is deposited as a zinc oxide-rich area. This zinc oxide-rich area can be deposited as film comprising at least about 40 angstroms of essentially pure zinc oxide directly beneath the second infrared-reflective layer, and the second infrared-reflective layer can be deposited as film comprising silver. The first and third dielectric materials can both the same material, if so desired, such that the first and third high concentration areas are both deposited as film rich in the same material. For example, the first and third dielectric materials can both be zinc oxide, such that the first and third high concentration areas are both deposited as zinc oxide-rich areas. Further, the second dielectric material can be deposited as an oxide selected from the group consisting of tin oxide, zinc tin oxide, and titanium oxide. In some cases, the first high concentration area is deposited as film comprising a first homogenous film region consisting essentially of the first dielectric material, the second high concentration area is deposited as film comprising a second homogenous film region consisting essentially of the second dielectric material, and the third high concentration area is deposited as film comprising a third homogenous film region consisting essentially of the third dielectric material. In these cases, each homogenous film region is preferably deposited at a thickness of less than 200 angstroms. Further, the second homogenous film region is preferably deposited at a thickness of less than about 180 angstroms. In some cases, the concentration-modulated middle coat is deposited as film comprising, in a contiguous sequence moving outwardly: a first high concentration area, the first high concentration area being rich in the first dielectric material; the first graded film region; a second high concentration area, the second high concentration area being rich in the second dielectric material; a second graded film region having a substantially continuously decreasing concentration of the second dielectric material and a substantially continuously increasing concentration of a third dielectric material, wherein the second and third dielectric materials are different materials; a third high concentration area, the third high concentration area being rich in the third dielectric material; a third graded film region having a substantially continuously decreasing concentration of the third dielectric material and a substantially continuously increasing concentration of a fourth dielectric material, wherein the third and fourth dielectric materials are different materials; a fourth high concentration area, the fourth high concentration area being rich in the fourth dielectric material; a fourth graded film region having a substantially continuously decreasing concentration of the fourth dielectric material and a substantially continuously increasing concentration of a fifth dielectric material, wherein the fourth and fifth dielectric materials are different materials; and a fifth high concentration area, the fifth high concentration area being rich in the fifth dielectric material. Preferably, the fifth dielectric material is zinc oxide, such that the fifth high concentration area is deposited as a zinc oxide-rich area. This zinc oxide-rich area can be advantageously deposited as film comprising at least about 40 angstroms of essentially pure zinc oxide directly beneath the second infrared-reflective layer, and the second infrared-reflective layer can be advantageously deposited as film comprising silver. If so desired, the first, third, and fifth dielectric materials can all be the same material, such that the first, third, and fifth high concentration areas are all deposited as film rich in the same material. For example, the first, third, and fifth dielectric materials can all be zinc oxide, such that the first, third, and fifth high concentration areas are all deposited as zinc oxide-rich areas. Further, the second and fourth dielectric materials can both be the same material, such that the second and fourth high concentration areas are both deposited as film rich in the same material. For example, the second and fourth dielectric materials can both be deposited as an oxide selected from the group consisting of tin oxide, zinc tin oxide, and titanium oxide. In some cases, the first high concentration area is deposited as film comprising a first homogenous film region consisting essentially of the first dielectric material, the second high concentration area is deposited as film comprising a second homogenous film region consisting essentially of the second dielectric material, the third high concentration area is deposited as film comprising a third homogenous film region consisting essentially of the third dielectric material, the fourth high concentration area is deposited as film comprising a fourth homogenous film region consisting essentially of the fourth dielectric material, and the fifth high concentration area is deposited as film comprising a fifth homogenous film region consisting essentially of the fifth dielectric material. Preferably, each homogenous film region is deposited at a thickness of less than 200 angstroms. Further, the second and fourth homogenous film regions are preferably each deposited at a thickness of less than about 180 angstroms. In some cases, the dielectric inner coat is deposited as a concentration-modulated inner coat comprising a second graded film region having a substantially continuously decreasing concentration of a third dielectric material and a substantially continuously increasing concentration of a fourth dielectric material, wherein the third and fourth dielectric materials are different materials. Additionally (or alternatively), the dielectric outer coat can be deposited as a concentration-modulated outer coat comprising a third graded film region having a substantially continuously decreasing concentration of a fifth dielectric material and a substantially continuously increasing concentration of a sixth dielectric material, wherein the fifth and sixth dielectric materials are different materials. In some cases of this nature, the concentration-modulated inner, middle, and outer coats are each deposited as film not including any discrete interface between homogenous dielectric layers.

In certain embodiments, the invention provides a method of producing coated substrates. In these embodiments, the method comprises depositing a low-emissivity coating upon a substrate, the coating comprising, in sequence outwardly: a concentration-modulated inner coat including a first graded film region having a substantially continuously decreasing concentration of tin oxide and a substantially continuously increasing concentration of zinc oxide or zinc tin oxide, wherein the first graded film region extends from a tin oxide-rich inner area to a zinc oxide-rich or zinc tin oxide-rich outer area; a first infrared-reflective layer comprising material that is highly reflective of solar radiation; a dielectric middle coat; a second infrared-reflective layer comprising material that is highly reflective of solar radiation; and a dielectric outer coat. Preferably, the tin oxide-rich inner area of the first graded film region is deposited as film consisting essentially of tin oxide. In some cases, the tin oxide-rich inner portion of the first graded film region is deposited directly over the substrate. In other cases, the low-emissivity coating further includes a base layer comprising silicon dioxide deposited directly over the substrate, the tin oxide-rich inner area of the first graded film region being deposited directly over the base layer. Preferably, the first infrared-reflective layer is deposited directly over the outer area of the first graded film region. The outer area of the first graded film region can be advantageously deposited as film comprising at least about 40 angstroms of essentially pure zinc oxide directly beneath the first infrared-reflective layer, and the first infrared-reflective layer can be advantageously deposited as film comprising silver. In some cases, the concentration-modulated inner coat is deposited as film comprising, in a contiguous sequence moving outwardly: a first high concentration area, the first high concentration area being rich in tin oxide; the first graded film region; a second high concentration area, the second high concentration area being rich in zinc oxide or zinc tin oxide; a second graded film region having a substantially continuously decreasing concentration of zinc oxide or zinc tin oxide and a substantially continuously increasing concentration of tin oxide; a third high concentration area, the third high concentration area being rich in tin oxide; a third graded film region having a substantially continuously decreasing concentration of tin oxide and a substantially continuously increasing concentration of zinc oxide or zinc tin oxide; and a fourth high concentration area, the fourth high concentration area being rich in zinc oxide or zinc tin oxide.

BRIEF DESCRIPTION OF THE DRAWINGS

FIG. 4 is a schematic side view of a sputtering apparatus in accordance with certain embodiments of the invention;

DETAILED DESCRIPTION OF PREFERRED EMBODIMENTS

Figure 1:
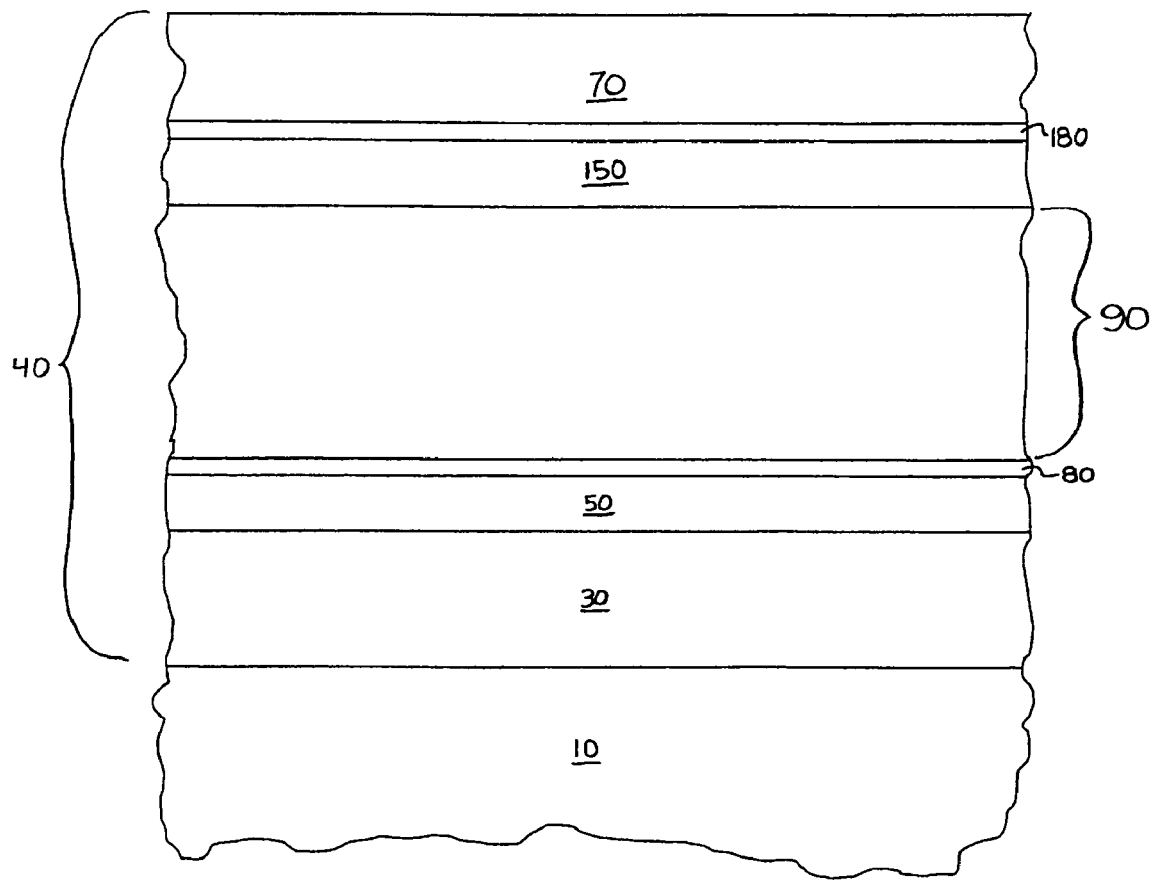
FIG. 1 is a partially broken-away, schematic, cross-sectional side view of a low-emissivity coating in accordance with certain embodiments of the present invention.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

Substrates of various size can be used in the present invention. Commonly, large-area substrates are used. Certain embodiments involve a substrate having a width of at least about 0.5 meter, preferably at least about 1 meter, perhaps more preferably at least about 1.5 meters (e.g., between about 2 meters and about 4 meters), and in some cases at least about 3 meters.

Substrates of various thickness can be used in the present invention. Commonly, substrates (e.g., glass sheets) with a thickness of about 1–5 mm are used. Certain embodiments involve a substrate with a thickness of between about 2.3 mm and about 4.8 mm, and perhaps more preferably between about 2.5 mm and about 4.8 mm. In some cases, a sheet of glass (e.g., soda-lime glass) with a thickness of about 3 mm will be used.

In certain embodiments, the invention provides a substrate 10 bearing a low-emissivity coating 40. A variety of substrates are suitable for use in the present invention. In most cases, the substrate is a sheet of transparent material (i.e., a transparent sheet). However, the substrate is not required to be transparent. For most applications, the substrate will comprise a transparent or translucent material, such as glass or clear plastic. In many cases, the substrate 10 will be a glass pane. A variety of known glass types can be used, and soda-lime glass is expected to be preferred.

In certain preferred embodiments, the low-emissivity coating 40 comprises a concentration-modulated middle coat 90. Here, the coating 40 includes two infrared-reflective layers 50, 150 (e.g., comprising silver) between which is positioned the concentration-modulated middle coat 90. Certain embodiments of this nature are exemplified in FIG. 1, wherein the illustrated coating 40 comprises, in sequence outwardly (i.e., in sequence moving away from the substrate): a dielectric inner coat 30; a first infrared-reflective layer 50; an optional first blocker layer 80; the concentration-modulated middle coat 90; a second infrared-reflective layer 150; an optional second blocker layer 180; and a dielectric outer coat 70. In these embodiments, the inner and outer coats can be formed of any desired dielectric films, including conventional homogenous dielectric layers (i.e., non-graded layers). Alternatively, one or both of the inner and outer coats can also have a graded composition, as described below.

The concentration-modulated middle coat 90 can be provided in various forms. Preferably, this middle coat 90 includes at least one graded film region. In other words, at least a portion of the concentration-modulated middle coat preferably has a graded composition (e.g., a composition that changes gradually with increasing distance from the substrate). By providing the middle coat 90 with one or more graded film regions, the coating 40 can be designed to achieve an exceptional range of color and antireflection properties. Further, special optical effects can be achieved using graded film. Moreover, the graded composition of the concentration-modulated middle coat is desirable in terms of low stress and good adhesion properties. For example, it eliminates discrete interfaces that would otherwise be candidates for delamination. In certain preferred embodiments, the middle coat 90 does not include any (i.e., is entirely free of) discrete interfaces between dielectric layers (e.g., between homogenous dielectric layers). For example, the entire middle coat 90 can be designed to have a gradually changing composition, with smooth transition from one dielectric material to the next.

In more detail, the concentration-modulated middle coat 90 includes a first graded film region having a substantially (or at least generally) continuously decreasing concentration of a first dielectric material and a substantially (or at least generally) continuously increasing concentration of a second dielectric material. Here, the first and second dielectric materials are different materials. Thus, the graded film region transitions (with increasing distance from the substrate) from one dielectric material to another dielectric material. Preferably, the concentration of the first dielectric material decreases gradually as the concentration of the second dielectric material increases gradually. Thus, there is preferably a smooth transition from one dielectric material to another. A middle coat 90 of this nature is superior (in terms of stress, adhesion, and color and antireflection opportunity) to a conventional middle coat formed by a plurality of discrete homogenous layers.

Thus, the middle coat 90 desirably includes a graded film region having a composition that transitions (as a function of film thickness) from one dielectric material to another. A wide variety of dielectric materials can be used in the graded film region. The term "dielectric" is used herein to refer to any non-metallic (i.e., neither a pure metal nor a metal alloy) compound that includes any one or more metals. In certain embodiments, each dielectric is a transparent dielectric that is generally or substantially transparent when deposited as a thin film. Included in the "dielectric" definition would be any metal oxide, metal nitride, metal carbide, metal sulfide, metal boride, and any combination thereof (e.g., an oxynitride). Further, the term "metal" is to be understood to include all metals and semi-metals (i.e., metalloids). Useful metal oxides include oxides of zinc, tin, indium, bismuth, titanium, hafnium, zirconium, and mixtures thereof. While metal oxides are desirable due to their ease and low cost of application, known metal nitrides (e.g., silicon nitride) can also be used. Skilled artisans will be familiar with other useful materials.

With respect to the graded nature of the film, in preferred embodiments the film in each graded film region is graded in a common manner over the entire area of the coated surface. Thus, at any given "x, y" location on the coated surface (where x and y are dimensions along two respective perpendicular axes on the coated surface), there exists the graded film (i.e., the described transition from one dielectric to another). The "z" dimension (i.e., the film thickness dimension) range over which the graded film region exists may vary slightly from one x, y location to another, e.g., due to local variations in the surface roughness of the substrate. For example, this could result by sputtering the coating over a glass substrate having preexisting surface roughness.

Preferably, the refractive index is substantially constant over the graded film region. That is, the graded film region preferably transitions from one dielectric material having a given refractive index to another dielectric material having substantially the same refractive index. Generally, this refractive index is between about 1.9 and about 2.75, preferably between about 1.9 and about 2.4, more preferably between about 1.9 and about 2.2, and perhaps optimally about 2.0. In alternate embodiments, the refractive index of the film in the graded film region varies, but not outside the range of 1.9–2.75, preferably not outside the range of 1.9–2.4, and perhaps optimally not outside the range of 1.9–2.2.

In certain particularly preferred embodiments, the refractive index is substantially constant over the entire thickness of the concentration-modulated middle coat 90. Here, even though the composition of the middle coat 90 changes with increasing distance from the substrate (at least across a portion of the middle coat 90), the refractive index is substantially uniform across an entire thickness of the middle coat 90. This refractive index is generally between about 1.9 and about 2.75, preferably between about 1.9 and about 2.4, more preferably between about 1.9 and about 2.2, and perhaps optimally about 2.0. In alternate embodiments, the refractive index of the film in the middle coat 90 varies, but not outside the range of 1.9–2.75, preferably not outside the range of 1.9–2.4, and perhaps optimally not outside the range of 1.9–2.2.

In certain favored embodiments, the concentration-modulated middle coat 90 is formed entirely of oxide film, or of nitride film, etc. For example, the middle coat 90 can be deposited using a single reactive gas type (oxidizing, nitriding, etc.) It will be appreciated that impurity gases may also be present in small amounts during deposition, such that the middle coat may include trace impurities. Particularly favored are methods wherein the middle coat includes at least one graded film region and is deposited using only oxidizing atmosphere, such that the middle coat is formed entirely of oxide film. Preferably, the middle coat includes at least one film region comprising tin oxide or zinc tin oxide, both of which are particularly desirable due to, inter alia, their morphology.

In certain embodiments, the first and second dielectric materials are two different oxides selected from the group consisting of zinc oxide, tin oxide, zinc tin oxide (e.g., $Zn_2SnO_4$), zinc aluminum oxide (e.g., $ZnOAl_2O_3$), and titanium oxide. Preferably, at least one of the first and second dielectric materials is tin oxide or zinc tin oxide. For example, the first and second dielectric materials can be two different oxides selected from the group consisting of zinc oxide, tin oxide, and zinc tin oxide. It is to be understood, however, that in other embodiments any two dielectric materials can be used. For example, the first and second dielectric materials can be selected and varied to meet the requirements of many different applications.

Thus, the concentration-modulated middle coat includes at least one graded film region characterized by a transition from one dielectric material to another. In some cases, this middle coat includes only one graded film region. In such cases, the second dielectric is preferably zinc oxide, while the first dielectric is preferably an oxide selected from the group consisting of tin oxide, zinc tin oxide, and titanium oxide, perhaps optimally tin oxide or zinc tin oxide. In one embodiment, the first dielectric is tin oxide, and the first graded film region extends from a tin oxide-rich inner area (adjacent the first infrared-reflective layer 50, e.g., over blocker layer 80 if provided) to a zinc oxide-rich outer area (adjacent the second infrared-reflective layer 150). Here, the tin oxide-rich inner area is preferably deposited directly over a first blocker layer 80, and the second infrared-reflective layer 150 is preferably deposited directly over the zinc oxide-rich outer area. This zinc oxide-rich outer area desirably comprises at least about 40 Å of essentially pure zinc oxide directly beneath the second infrared-reflective layer 150, at least if this layer 150 comprises silver.

Thus, the middle coat 90 may comprise a single graded film region extending from a tin oxide-rich inner area to a zinc oxide-rich outer area. In such embodiments, the middle coat includes at least two high concentration areas (the tin oxide-rich inner area is a first high concentration area and the zinc oxide-rich outer area is a second high concentration area). Each high concentration area is a thickness of film having a local maximum concentration of a desired dielectric material. In some cases, each high concentration area has a major concentration (i.e., 50% or more) of the desired dielectric material. If so desired, each high concentration area can be a thickness of film consisting essentially of the desired dielectric material. For example, each high concentration area can comprise a homogenous film region consisting essentially of the desired dielectric material.

Table 1 depicts an embodiment wherein the middle coat 90 comprises, in a contiguous sequence moving outwardly: (1) a first homogenous film region consisting essentially of tin oxide; (2) a first graded film region having a substantially continuously decreasing concentration of tin oxide and a substantially continuously increasing concentration of zinc oxide; and (3) a second homogenous film region consisting essentially of zinc oxide. Here, the second homogenous film region desirably comprises at least about 40 Å of essentially pure zinc oxide directly beneath the second infrared-reflective layer 150, which desirably is a silver film (but may simply include some silver or be an infrared-reflective film that does not contain silver, as may also be the case in any of the tables of the present disclosure).

The symbol "→" (i.e., an arrow) is used herein to refer to a change (e.g., a gradual change) in film composition, with increasing distance from the substrate, from the dielectric material identified at the base of the arrow to the dielectric material identified at the tip of the arrow.

TABLE 1 glass/inner coat/silver/blocker/tin oxide→zinc oxide/silver/blocker/outer coat

Thus, in certain embodiments, the middle coat includes at least one homogenous film region. The film in each homogenous film region does not have a composition that is graded or otherwise varied as a function of film thickness/distance from the substrate. Rather, each such region is a thickness of film having a homogenous composition (of a desired dielectric material). Preferably, each homogenous film region is bounded by (and transitions gradually into) one or two graded film regions. In contrast, a conventional discrete homogenous dielectric layer is bounded by two discrete interfaces with other layers. In some cases, the middle coat 90 includes a plurality of homogenous film regions, each formed of a desired dielectric material. In these cases, each homogenous film region preferably has a thickness of less than 200 Å, and perhaps more preferably less than about 180 Å, and perhaps optimally less than about 175 Å. These thickness limits are desirable for minimizing stress, maximizing adhesion, limiting defect growth, and avoiding haze formation, e.g., during heat treatment. Thus, in some embodiments, the middle coat 90 does not include any homogenous film region having a thickness of 200 Å or more.

Notwithstanding the foregoing, it is to be appreciated that the middle coat 90 need not include any homogenous film region(s). For example, the invention provides embodiments wherein the concentration of the entire middle coat 90 changes constantly with increasing distance from the substrate. In many embodiments, though, the middle coat comprises at least one homogenous film region (e.g., at least about 40 angstroms of essentially pure zinc oxide directly beneath the second infrared-reflective layer 150).

Figure 2:
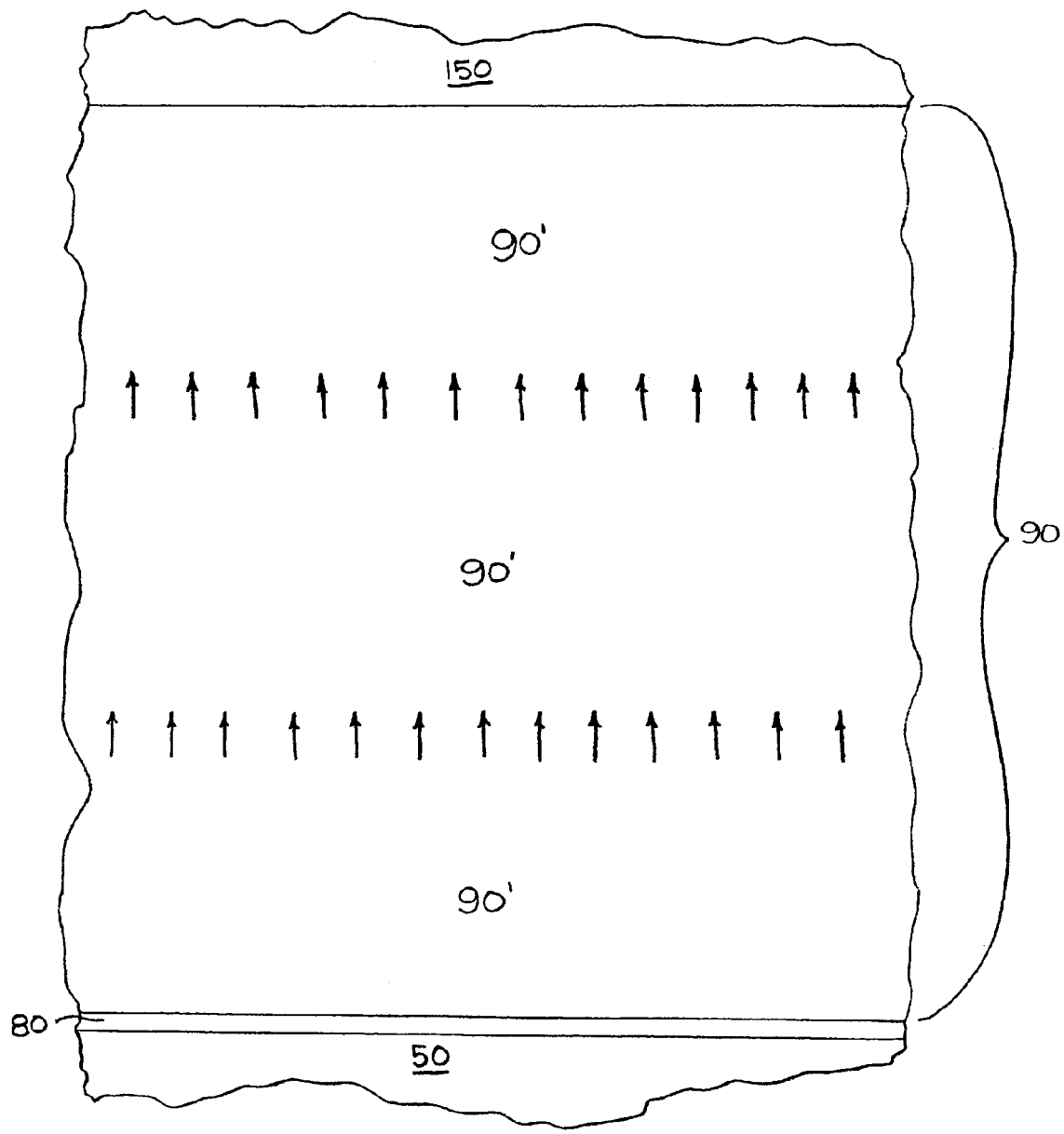
FIG. 2 is a broken-away, schematic, cross-sectional side view of a middle portion of a low-emissivity coating in accordance with certain embodiments of the invention.
Figure 3:
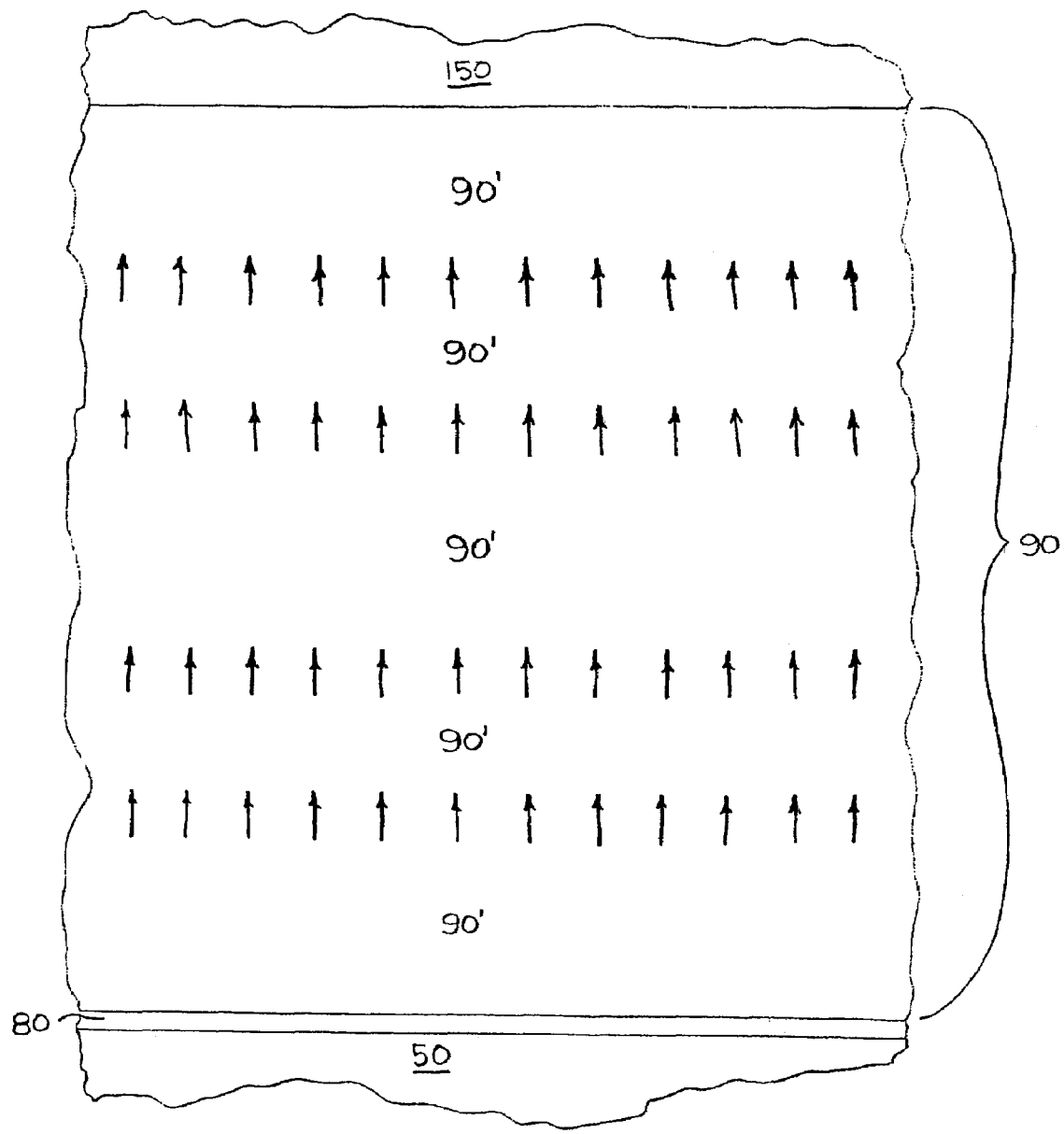
FIG. 3 is a broken-away, schematic, cross-sectional side view of a middle portion of a low-emissivity coating in accordance with certain embodiments of the invention.

The invention provides several particularly desirable middle coat designs. A first design provides a middle coat 90 comprising two graded film regions interposed among three high concentration areas. Embodiments of this nature are exemplified in FIG. 2. A second design provides a middle coat 90 comprising three graded film regions interposed among five high concentration areas. Embodiments of this nature are exemplified in FIG. 3. In FIGS. 2 and 3, each high concentration area is identified by the reference character 90' and each row of arrows identifies a graded film region. Each of these two designs yields an exceptional "double-type" low-emissivity coating (i.e., a coating having two infrared-reflective layers). For example, these designs have a symmetrical configuration that yields exceptional optical properties.

In the first design, the concentration-modulated middle coat 90 includes three high concentration areas and two graded film regions. For example, the middle coat 90 can comprise, in a contiguous sequence moving outwardly: a first high concentration area; a first graded film region; a second high concentration area; a second graded film region; and a third high concentration area. Here, the first high concentration area is rich in a first dielectric material, the second high concentration area is rich in a second dielectric material, and the third high concentration area is rich in a third dielectric material. The first graded film region has a substantially continuously decreasing concentration of the first dielectric and a substantially continuously increasing concentration of the second dielectric. The second graded film region has a substantially continuously decreasing concentration of the second dielectric and a substantially continuously increasing concentration of the third dielectric. In these embodiments, the first and second dielectrics are different materials, and the second and third dielectrics are different materials, however the first and third dielectrics can be the same material. Preferably, at least one of the first, second, and third dielectric materials is tin oxide or zinc tin oxide.

In preferred embodiments of this nature, the third dielectric material is zinc oxide, such that the third high concentration area is a zinc oxide-rich area. Table 2 exemplifies such coatings. Preferably, the second infrared-reflective layer 150 comprises silver positioned directly over the zinc oxide-rich, third high concentration area, which desirably comprises at least about 40 Å of essentially pure zinc oxide.

In the embodiments of FIG. 2, the first and third dielectrics can both be the same material, such that the first and third high concentration areas are both rich in the same material. In preferred embodiments of this nature, the first and third dielectrics are both zinc oxide such that the first and third high concentration areas are both zinc oxide-rich areas. In these embodiments, the second dielectric material desirably is an oxide selected from the group consisting of tin oxide, zinc tin oxide, zinc aluminum oxide, and titanium oxide, preferably tin oxide or zinc tin oxide.

In some cases, the first, second, and third high concentration areas 90' all comprise homogenous film regions. That is, the first high concentration area comprises a first homogenous film region consisting essentially of a first dielectric material, the second high concentration area comprises a second homogenous film region consisting essentially of a second dielectric material, and the third high concentration area comprises a third homogenous film region consisting essentially of a third dielectric material. In these embodiments, each homogenous film region desirably has a thickness of less than 200 Å. Conjointly, the second homogenous film region desirably has a thickness of less than about 180 Å.

TABLE 2 glass/inner coat/silver/blocker/zinc oxide→tin oxide→zinc oxide/silver/blocker/outer coat
glass/inner coat/silver/blocker/zinc oxide→zinc tin oxide→zinc oxide/silver/blocker/outer coat
glass/inner coat/silver/blocker/zinc oxide→zinc aluminum oxide→zinc oxide/silver/blocker/outer coat
glass/inner coat/silver/blocker/zinc oxide→titanium oxide→zinc oxide/silver/blocker/outer coat
glass/inner coat/silver/blocker/zinc tin oxide→tin oxide→zinc oxide/silver/blocker/outer coat
glass/inner coat/silver/blocker/zinc tin oxide→zinc aluminum oxide→zinc oxide/silver/blocker/outer coat
glass/inner coat/silver/blocker/zinc tin oxide→titanium oxide→zinc oxide/silver/blocker/outer coat
glass/inner coat/silver/blocker/zinc aluminum oxide→tin oxide→zinc oxide/silver/blocker/outer coat
glass/inner coat/silver/blocker/zinc aluminum oxide→zinc tin oxide→zinc oxide/silver/blocker/outer coat
glass/inner coat/silver/blocker/zinc aluminum oxide→titanium oxide→zinc oxide/silver/blocker/outer coat In the embodiments of FIG. 3, the concentration-modulated middle coat 90 includes five high concentration areas and four graded film regions. Here, the middle coat 90 comprises, in a contiguous sequence moving outwardly: a first high concentration area; a first graded film region; a second high concentration area; a second graded film region; a third high concentration area; a third graded film region; a fourth high concentration area; a fourth graded film region; and a fifth high concentration area. In more detail, the first high concentration area is rich in a first dielectric material, the second high concentration area is rich in a second dielectric material, the third high concentration area is rich in a third dielectric material, the fourth high concentration area is rich in a fourth dielectric material, and the fifth high concentration area is rich in a fifth dielectric material. The first graded film region has a substantially continuously decreasing concentration of the first dielectric and a substantially continuously increasing concentration of the second dielectric. The second graded film region has a substantially continuously decreasing concentration of the second dielectric and a substantially continuously increasing concentration of the third dielectric. The third graded film region has a substantially continuously decreasing concentration of the third dielectric and a substantially continuously increasing concentration of the fourth dielectric. The fourth graded film region has a substantially continuously decreasing concentration of the fourth dielectric and a substantially continuously increasing concentration of the fifth dielectric. In these embodiments, the first and second dielectrics are different materials, the second and third dielectrics are different materials, the third and fourth dielectrics are different materials, and the fourth and fifth dielectrics are different materials. However, the first and fifth dielectrics can be the same material, the second and fourth dielectrics can be the same material, etc. Preferably, at least one of the first, second, third, fourth, and fifth dielectric materials is tin oxide or zinc tin oxide.

In preferred embodiments of this nature, the fifth dielectric material is zinc oxide, such that the fifth high concentration area is a zinc oxide-rich area. Table 3 exemplifies coatings of this nature. Preferably, the second infrared-reflective layer 150 comprises silver positioned directly over the zinc oxide-rich, fifth high concentration area, which desirably comprises at least about 40 Å of essentially pure zinc oxide.

In the embodiments of FIG. 3, the first, third, and fifth dielectrics can all be the same material, such that the first, third, and fifth high concentration areas are all rich in the same material. In preferred embodiments of this nature, the first, third, and fifth dielectrics are all zinc oxide (i.e., the first, third, and fifth high concentration areas are all zinc oxide-rich areas). Alternatively or additionally, the second and fourth dielectrics can both be the same material, such that the second and fourth high concentration areas are both rich in the same material. For example, the second and fourth dielectric materials can both be an oxide selected from the group consisting of tin oxide, zinc tin oxide, zinc aluminum oxide, and titanium oxide, perhaps optimally tin oxide or zinc tin oxide.

TABLE 3 glass/inner coat/silver/blocker/zinc oxide→tin oxide→zinc oxide→tin oxide→zinc oxide/silver/blocker/outer coat
glass/inner coat/silver/blocker/zinc oxide→zinc tin oxide→zinc oxide→zinc tin oxide→zinc oxide/silver/blocker/outer coat
glass/inner coat/silver/blocker/zinc oxide→zinc aluminum oxide→zinc oxide→zinc aluminum oxide→zinc oxide/silver/blocker/outer coat
glass/inner coat/silver/blocker/zinc oxide→titanium oxide→zinc oxide→titanium oxide→zinc oxide/silver/blocker/outer coat
glass/inner coat/silver/blocker/zinc tin oxide→tin oxide→zinc tin oxide→tin oxide→zinc oxide/silver/blocker/outer coat
glass/inner coat/silver/blocker/zinc tin oxide→zinc aluminum oxide→zinc tin oxide→zinc aluminum oxide→zinc oxide/silver/blocker/outer coat
glass/inner coat/silver/blocker/zinc tin oxide→titanium oxide→zinc tin oxide→titanium oxide→zinc oxide/silver/blocker/outer coat
glass/inner coat/silver/blocker/zinc aluminum oxide→tin oxide→zinc aluminum oxide→tin oxide→zinc oxide/silver/blocker/outer coat
glass/inner coat/silver/blocker/zinc aluminum oxide→zinc tin oxide→zinc aluminum oxide→zinc tin oxide→zinc oxide/silver/blocker/outer coat
glass/inner coat/silver/blocker/zinc aluminum oxide→titanium oxide→zinc aluminum oxide→titanium oxide→zinc oxide/silver/blocker/outer coat
glass/inner coat/silver/blocker/tin oxide→zinc tin oxide→tin oxide→zinc tin oxide→zinc oxide/silver/blocker/outer coat
glass/inner coat/silver/blocker/tin oxide→zinc aluminum oxide→tin oxide→zinc aluminum oxide→zinc oxide/silver/blocker/outer coat TABLE 3-continued glass/inner coat/silver/blocker/tin oxide→titanium oxide→tin oxide→titanium oxide→zinc oxide/silver/blocker/outer coat In certain embodiments, the first, second, third, fourth, and fifth high concentration areas all comprise homogenous film regions. That is, the first high concentration area comprises a first homogenous film region consisting essentially of a first dielectric material, the second high concentration area comprises a second homogenous film region consisting essentially of a second dielectric material, the third high concentration area comprises a third homogenous film region consisting essentially of a third dielectric material, the fourth high concentration area comprises a fourth homogenous film region consisting essentially of a fourth dielectric material, and the fifth high concentration area comprises a fifth homogenous film region consisting essentially of a fifth dielectric material. In these embodiments, each homogenous film region desirably has a thickness of less than 200 Å. Conjointly, the second and fourth homogenous film regions each desirably has a thickness of less than about 180 Å.

In one embodiment, the first dielectric material is zinc oxide, the second dielectric material is tin oxide, the third dielectric material is titanium oxide (or zinc tin oxide), the fourth dielectric material is tin oxide, and the fifth dielectric material is zinc oxide. In another embodiment, the first dielectric material is zinc oxide, the second dielectric material is titanium oxide, the third dielectric material is tin oxide (or zinc tin oxide), the fourth dielectric material is titanium oxide, and the fifth dielectric material is zinc oxide. In still another embodiment, the first dielectric material is zinc oxide, the second dielectric material is zinc tin oxide, the third dielectric material is tin oxide (or titanium oxide), the fourth dielectric material is zinc tin oxide, and the fifth dielectric material is zinc oxide. In yet another embodiment, the first dielectric material is zinc tin oxide, the second dielectric material is tin oxide, the third dielectric material is titanium oxide, the fourth dielectric material is tin oxide, and the fifth dielectric material is zinc oxide. In still another embodiment, the first dielectric material is zinc tin oxide, the second dielectric material is titanium oxide, the third dielectric material is tin oxide, the fourth dielectric material is titanium oxide, and the fifth dielectric material is zinc oxide. In yet another embodiment, the first dielectric material is tin oxide, the second dielectric material is titanium oxide, the third dielectric material is zinc tin oxide, the fourth dielectric material is titanium oxide, and the fifth dielectric material is zinc oxide. In a further embodiment, the first dielectric material is tin oxide, the second dielectric material is zinc tin oxide, the third dielectric material is titanium oxide, the fourth dielectric material is tin oxide, and the fifth dielectric material is zinc oxide. Many other variations will be apparent to skilled artisans.

It is particularly preferred to provide the coating 40 with a concentration-modulated middle coat 90. The middle coat of a double-type low-emissivity coating characteristically has a relatively great thickness. For example, it is common for the middle coat to be at least about twice as thick as the inner coat and/or at least about twice as thick as the outer coat. As a result, the drawbacks associated with thick dielectric layers are particularly acute with respect to the middle coat. It is thus particularly preferred, especially in terms of reduced stress, to provide the middle coat with the graded film region(s) described above.

Various embodiments have been described wherein the coating 40 has a concentration-modulated middle coat 90. In some of these embodiments, the coating is also provided with a concentration-modulated inner coat 30. Here, the inner coat includes a graded film region having a substantially continuously decreasing concentration of one desired dielectric and a substantially continuously increasing concentration of another desired dielectric. In embodiments of this nature, the coating can also be provided with a concentration-modulated outer coat. Here, the outer coat includes a third graded film region having a substantially continuously decreasing concentration of one dielectric and a substantially continuously increasing concentration of another dielectric. In these embodiments, the concentration-modulated inner, middle, and outer coats preferably do not include any discrete interfaces between homogenous dielectric layers.

Thus, the invention provides desirable embodiments wherein the coating 40 includes a concentration-modulated inner coat 30, a concentration-modulated middle coat 90, and a concentration-modulated outer coat 70. Table 4 exemplifies coatings of this nature. Here, the terms "D1", "D2", etc. refer respectively to a first dielectric material, a second dielectric material, etc. (D1 and D2 are different materials, and so on, though, D1 and D3 can be the same material, etc.). As noted above, each arrow represents a film composition gradient wherein, with increasing distance from the substrate, the composition of the film transitions from one material (the material identified left of the arrow) to another material (the material identified right of the arrow). These embodiments do not require use of any particular dielectric materials. Rather, any desired dielectrics can be used. Certain dielectrics, however, are preferred. Preferably, all the film in the base coat 30 is deposited using the same reactive gas type (oxidizing, or nitriding, etc.), such that the base coat consists essentially of oxide film or nitride film, etc. This is also preferable for the middle 90 and outer 70 coats, as it allows for particularly convenient deposition methods. In particularly preferred embodiments, the entire coating 40 does not (or at least the inner coat 30, the middle coat 90, and the outer coat 70 do not) include any discrete interfaces between homogenous dielectric layers.

TABLE 4 glass/D1→D2/silver/blocker/D3→D4/silver/blocker/D5→D6
glass/D1→D2/silver/blocker/D3→D4→D5/silver/blocker/D6→D7
glass/D1→D2/silver/blocker/D3→D4→D5→D6→D7/silver/blocker/D8→D9
glass/D1→D2→D3/silver/blocker/D4→D5→D6/silver/blocker/D7→D8
glass/D1→D2/silver/blocker/D3→D4→D5/silver/blocker/D6→D7→D8

The invention provides a number of embodiments wherein the coating comprises a particularly desirable concentration-modulated inner coat. Here, the modulated inner coat has an inner area comprising tin oxide and an outer area comprising zinc oxide, zinc tin oxide, or zinc aluminum oxide. In some embodiments of this nature, the coating 40 is a double-type low-emissivity coating comprising, in sequence outwardly: a concentration-modulated inner coat 30; a first infrared-reflective layer 50; an optional first blocker layer 80; a dielectric middle coat 90; a second infrared-reflective layer 150; an optional second blocker layer 180; and a dielectric outer coat 70. Here, the middle and outer coats can be formed of any desired dielectric films, including conventional homogenous dielectric layers. Alternatively, one or both of the middle and outer coats can have a graded composition, as noted above. In other embodiments of this nature, the coating is a "single type" low-emissivity coating (i.e., a low-emissivity coating having a single infrared-reflective layer) comprising, in sequence outwardly: a concentration-modulated inner coat; an infrared-reflective layer; an optional blocker layer; and a dielectric outer coat. Here, the outer coat can be formed of any desired dielectric films, including conventional homogenous dielectric layers. Alternatively, the outer coat can have a graded composition.

Figure 5B:
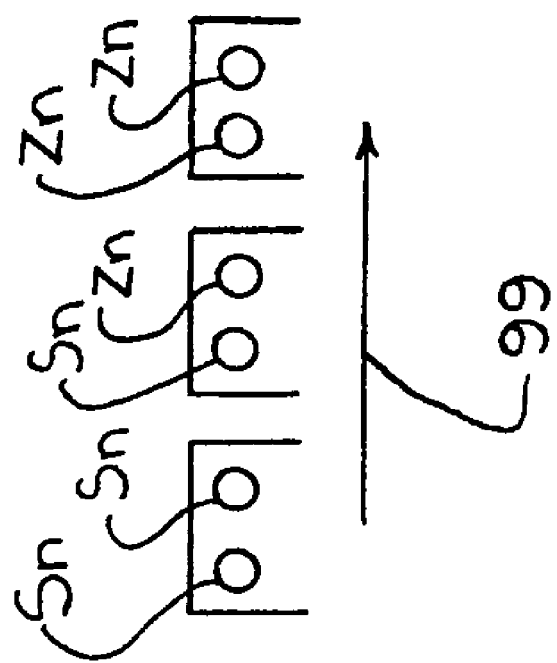
FIG. 5B is a schematic side view of a sputtering apparatus in accordance with certain embodiments of the invention.

Preferably, the concentration-modulated inner coat includes a first graded film region having a substantially continuously decreasing concentration of tin oxide and a substantially continuously increasing concentration of zinc oxide, zinc tin oxide, or zinc aluminum oxide. Table 5 exemplifies coatings of this nature. Here, the first graded film region has an inner area that is rich in tin oxide and an outer area that is rich in zinc oxide, zinc tin oxide, or zinc aluminum oxide. Perhaps optimally, the outer area is rich in zinc oxide. An inner coat of this nature can be produced, for example, using the sputtering apparatus depicted in FIG. 5B. In embodiments of this nature, the infrared-reflective layer 50 is desirably deposited directly over the zinc oxide-rich outer area of the inner coat. Conjointly, this zinc oxide-rich outer area desirably comprises at least about 40 angstroms of essentially pure zinc oxide, while the infrared-reflective layer 50 desirably is a silver film.

TABLE 5 glass/tin oxide→zinc oxide/silver/blocker/middle coat/silver/blocker/outer coat
glass/tin oxide→zinc oxide/silver/blocker/outer coat
glass/tin oxide→zinc tin oxide/silver/blocker/middle coat/silver/blocker/outer coat
glass/tin oxide→zinc tin oxide/silver/blocker/outer coat
glass/tin oxide→zinc aluminum oxide/silver/blocker/middle coat/silver/blocker/outer coat
glass/tin oxide→zinc aluminum oxide/silver/blocker/outer coat In the embodiments of Table 5, the tin oxide-rich inner area (which preferably consists essentially of tin oxide) can be deposited directly over the substrate. Alternatively, the coating can further include a transparent base layer comprising silicon dioxide deposited directly over the substrate (preferably at less than 100 Å, and perhaps optimally at about 50 Å–100 Å). In such cases, the tin oxide-rich inner area is preferably deposited directly over the silicon dioxide. Some preferred embodiments of this nature are exemplified by the first six coatings in Table 6. Other preferred embodiments are exemplified by the last six coatings in Table 6, wherein the silicon dioxide is deposited directly over the substrate, and this silicon dioxide transitions to tin oxide, which subsequently transitions to zinc oxide, zinc tin oxide, or zinc aluminum oxide. These embodiments provide an extraordinarily durable foundation for the coating.

TABLE 6 glass/silicon dioxide/tin oxide→zinc oxide/silver/blocker/middle coat/silver/blocker/outer coat
glass/silicon dioxide/tin oxide→zinc tin oxide/silver/blocker/middle coat/silver/blocker/outer coat
glass/silicon dioxide/tin oxide→zinc aluminum oxide/silver/blocker/middle coat/silver/blocker/outer coat
glass/silicon dioxide/tin oxide→zinc oxide/silver/blocker/outer coat
glass/silicon dioxide/tin oxide→zinc tin oxide/silver/blocker/outer coat
glass/silicon dioxide/tin oxide→zinc aluminum oxide/silver/blocker/outer coat
glass/silicon dioxide→tin oxide→zinc oxide/silver/blocker/middle coat/silver/blocker/outer coat
glass/silicon dioxide→tin oxide→zinc tin oxide/silver/blocker/middle coat/silver/blocker/outer coat
glass/silicon dioxide→tin oxide→zinc aluminum oxide/silver/blocker/middle coat/silver/blocker/outer coat
glass/silicon dioxide→tin oxide→zinc oxide/silver/blocker/outer coat
glass/silicon dioxide→tin oxide→zinc tin oxide/silver/blocker/outer coat
glass/silicon dioxide→tin oxide→zinc aluminum oxide/silver/blocker/outer coat In certain preferred embodiments, the invention provides a concentration-modulated inner coat comprising in a contiguous sequence moving outwardly: (i) a first high concentration area, the first high concentration area being rich in tin oxide; (ii) a first graded film region having a substantially continuously decreasing concentration of tin oxide and a substantially continuously increasing concentration of zinc oxide; (iii) a second high concentration area, the second high concentration area being rich in zinc oxide; (iv) a second graded film region having a substantially continuously decreasing concentration of zinc oxide and a substantially continuously increasing concentration of tin oxide; (v) a third high concentration area, the third high concentration area being rich in tin oxide; (vi) a third graded film region having a substantially continuously decreasing concentration of tin oxide and a substantially continuously increasing concentration of zinc oxide; and (vii) a fourth high concentration area, the fourth high concentration area being rich in zinc oxide. An inner coat of this nature can be produced, for example, using the sputtering apparatus of FIG. 5A.

With respect to the infrared-reflective film, silver preferably is used. While other infrared-reflective metals (e.g., copper, gold, platinum, palladium, nickel, and alloys) can be used, silver provides the lowest emissivity and best color neutrality. In other cases, the infrared-reflective film comprises material other than silver, but is entirely metallic or essentially metallic (comprising no more than one atomic percent of non-metal material). Preferably, though, pure silver or substantially pure silver (comprising no more than five atomic percent of other material) is used. This provides the lowest emissivity possible. Each infrared-reflective film can, for example, be deposited by sputtering a silver target in an inert atmosphere. Each infrared-reflective film may have discrete inner and outer interfaces with the underlying and overlying films, respectively. In a double-type low-emissivity coating, for example, a first silver film may have a discrete inner interface with an underlying inner coat 30 and a discrete outer interface with an overlying film (which may be a blocker layer 80 or the middle coat 90), and a second silver film may have a discrete inner interface with an underlying middle coat 90 and a discrete outer interface with an overlying film (which may be a blocker layer 180 or the outer coat 70). These embodiments are preferred because, inter alia, they impart exceptionally low emissivity in the coating 40.

Preferably, the total physical thickness of the inner coat is less than 200 angstroms. Each infrared-reflective (e.g., silver) film preferably has a physical thickness of between about 40 angstroms and about 190 angstroms. In embodiments wherein the coating includes two infrared-reflective films, the middle coat desirably has a total physical thickness of between about 150 angstroms and abut 700 angstroms. The total physical thickness of the outer coat, whether the coating has one or more infrared-reflective layers, is preferably between about 100 angstroms and about 300 angstroms. It is to be understood, however, that the thickness ranges noted in this paragraph are merely preferred, and many embodiments are anticipated wherein the actual thicknesses will fall outside these ranges.

In certain embodiments, the coating includes one or more graded film region each transitioning from a first oxide of zinc and tin to a second oxide of zinc and tin. For example, such a graded film region may be formed by sequentially conveying a substrate past the following sputtering targets: a first target formed of pure or essentially pure tin, a second target formed of a high tin content (e.g., about 40% tin or more) zinc-tin material, a third target formed of a low tin content (e.g., about 20% tin or less) zinc-tin material, and a fourth target formed of pure or essentially pure zinc. A graded film region of this nature can be used in the inner coat, the middle coat, or the outer coat.

The invention also provides desirable methods for producing coated substrates. Generally, these methods involve depositing a coating 40 that includes a dielectric inner coat 30, a dielectric middle coat 90, and a dielectric outer coat 70, at least one of which comprises a graded film region. Various suitable coatings of this nature have been described, and the present methods extend to the deposition of any of the described coatings.

The present methods preferably involve depositing graded film without producing any abrupt change in film composition (such that the composition of the film in each graded film region has no sudden discontinuity). Preferably, the graded film is deposited so as to provide a gradual transition from one dielectric material to the next (as a function of film thickness/distance from the substrate). This is desirably accomplished by a sputtering process that involves using a common target material for the last target in a desired sputtering bay and for the first (or only) target in the subsequent bay, and by using a common target material for the first target in the desired bay and for the last (or only) target in the preceding bay. In certain embodiments, each sputtering bay is separated from each adjacent bay by at least one chamber wall. This wall characteristically defines a narrow passage through which substrates can be conveyed (e.g., over rollers or other substrate supports defining a path of substrate travel) from one bay to the next. The present methods allow manufacturers to optimize the properties of the dielectric inner, middle, and/or outer coats, while avoiding discrete interfaces, where stress tends otherwise to pile up (i.e., be concentrated).

In certain embodiments, the method comprises conveying a substrate through at least three adjacent sputtering bays each adapted for depositing dielectric film (e.g., each containing a reactive sputtering atmosphere and/or a ceramic target). The term "adjacent sputtering bays" is used herein to refer to sputtering bays through which a substrate is conveyed sequentially without being passed through any other bay. At least one of these three bays is equipped with two or more sputtering targets, of which at least two carry different sputterable materials. The first target in this bay (the "transition" bay) carries the same sputterable material as the last (or only) target in the preceding bay. The last target in the transition bay carries the same sputterable material as the first (or only) target in the subsequent bay. This is perhaps best understood with reference to FIGS. 4–5B. (It is to be understood that the targets in the transition bay are sputtered in a common (i.e., shared) sputtering atmosphere.)

FIG. 4 depicts one particular sputtering apparatus that can be used to deposit a concentration-modulated middle coat 90. This arrangement of sputtering targets can be used, for example, to produce the middle coat of the first coating in Table 3. Here, the substrate is conveyed through two sputtering bays each equipped with two zinc targets. These two bays are preferably provided with an oxidizing atmosphere, as is preferred in all the bays. The innermost area of the middle coat is thus deposited as a first homogenous film region, which consists essentially of zinc oxide. Next, the substrate is conveyed through a bay in which the first target is zinc and the second target is tin. As the substrate moves through this bay (along the path of substrate travel 99), the substrate is exposed initially to a relatively great amount of zinc oxide flux, and is exposed to a gradually decreasing amount of zinc oxide flux and a gradually increasing amount of tin oxide flux, and toward the end of the bay is exposed to a relatively great amount of tin oxide flux. Thus, a first graded film region is deposited in this bay. The substrate is then conveyed through a bay equipped with two tin targets. In these two bays, there is deposited a second homogenous film region, which consists essentially of tin oxide. Next, the substrate is conveyed through a bay in which the first target is tin and the second target is zinc. A second graded film region is deposited in this bay. The substrate is then conveyed through two sputtering bays each equipped with two zinc targets. In these two bays, there is deposited a third homogenous film region, which consists essentially of zinc oxide. Then, the substrate is conveyed through a bay in which the first target is zinc and the second target is tin. Here, a third graded film region is deposited. The substrate is then conveyed through a bay equipped with two tin targets. In these two bays, there is deposited a fourth homogenous film region, which consists essentially of tin oxide. Next, the substrate is conveyed through a bay in which the first target is tin and the second target is zinc. Here, a fourth graded film region is deposited. Finally, the substrate is conveyed through two sputtering bays each equipped with two zinc targets, whereby the outermost area of the middle coat is deposited as a fifth homogenous film region, which consists essentially zinc oxide.

Thus, the substrate is not exposed to any abrupt changes in the composition of the flux to which it is exposed when conveyed through the sputtering line. It will be appreciated that FIG. 4 only depicts part of the sputtering line or coater through which the substrate is conveyed. The line or coater includes other sputtering bays (not shown in FIG. 4) in which the remaining portions of the coating 40 are deposited. Sputtering lines and coaters are well known and therefore certain conventional details (e.g., the rollers or other substrate support, the bottom of the coater, etc.) are not illustrated here.

Figure 5A:
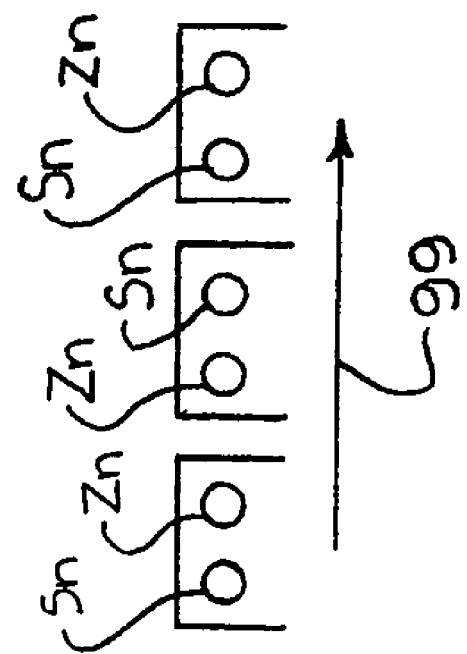
FIG. 5A is a schematic side view of a sputtering apparatus in accordance with certain embodiments of the invention.

FIG. 5A depicts one particular sputtering apparatus that can be used to deposit a concentration-modulated inner coat 30. This arrangement of sputtering targets can be used, for example, to produce a middle coat having the following structure: tin oxide→zinc oxide→tin oxide→zinc oxide. Here, the substrate is conveyed through a sputtering bay in which the first target is tin and the second target is zinc. Next, the substrate is conveyed through a bay in which the first target is zinc and the second target is tin. The substrate is then conveyed through a bay in which the first target is tin and the second target is zinc. Finally, the substrate is conveyed through a bay in which the first target is zinc and the second target is tin.

It is to be understood that the films stacks depicted in the tables of this disclosure are not required to consist only of the illustrated films. Rather, other films can be interposed among (e.g., between, beneath, and/or over) the illustrated films. Thus, the films in the tables are in a sequence, though not necessarily a contiguous sequence. In preferred embodiments, though, the illustrated films are in a contiguous sequence. Further, the tables denote silver infrared-reflective layers 50, 150, although it is to be understood that other reflective materials can be used. In addition, the tabulated coatings are denoted as including blocker layers, although the blocker layers are not strictly required. For purposes of this particular disclosure, the blocker layer 80 when provided is not considered to be part of the middle coat 90, nor is the blocker layer 180 when provided considered to be part of the outer coat 70. Preferably, when the blocker layers are provided, each blocker layer is not a homogenous dielectric layer, but rather has a metallic inner area and a dielectric outer area. Absent an express indication to the contrary, the thicknesses reported herein are physical thicknesses, rather than optical thicknesses. The terms "substantially continuously decreasing concentration", "substantially continuously increasing concentration", and the like are used herein to refer to a transition, with increasing distance from the substrate, from one dielectric material to another, wherein the transition occurs over the thickness of the graded film region, rather than at a discrete interface where one material changes abruptly to another. Each such transition is preferably, though not necessarily, a gradual transition. In the disclosed embodiments involving zinc tin oxide film, the tin atoms may, for example, account for less than about 5–10 atomic percent relative to all the metal atoms in the film. With respect to the aluminum in the disclosed zinc aluminum film, the aluminum atoms may, for example, account for less than about 2 atomic percent relative to all the metal atoms in the film.

While preferred embodiments of the present invention have been described, it should be understood that numerous changes, adaptations, and modifications can be made therein without departing from the spirit of the invention and the scope of the appended claims.

What is claimed is:

1. A substrate bearing a low-emissivity coating comprising, in sequence outwardly:
   a) a dielectric inner coat;
   b) a first infrared-reflective layer comprising material that is highly reflective of solar radiation;
   c) a concentration-modulated middle coat including a first graded film region having a substantially continuously decreasing concentration of a first dielectric material and a substantially continuously increasing concentration of a second dielectric material, wherein the first and second dielectric materials are different materials having refractive indexes that are substantially the same such that the first graded film region transitions from one dielectric material having a given refractive index to another dielectric material having substantially the same refractive index;
   d) a second infrared-reflective layer comprising material that is highly reflective of solar radiation; and
   e) a dielectric outer coat;
   wherein each infrared-reflective layer is substantially pure silver having discrete inner and outer interfaces with underlying and overlying films.

2. The substrate of claim 1 wherein the concentration-modulated middle coat does not include any discrete interface between homogenous dielectric layers.

3. The substrate of claim 1 wherein the concentration-modulated middle coat does not include any homogenous film region having a thickness of 200 angstroms or more.

4. The substrate of claim 1 wherein in the first graded film region the concentration of the first dielectric material decreases gradually as the concentration of the second dielectric material increases gradually.

5. The substrate of claim 1 wherein the concentration-modulated middle coat has an index of refraction that is substantially uniform across an entire thickness of the middle coat.

6. The substrate of claim 5 wherein said index of refraction is between about 1.9 and about 2.2.

7. The substrate of claim 1 wherein the first dielectric material is tin oxide and the second dielectric material is zinc oxide, and wherein the first graded film region extends from a tin oxide-rich inner area to a zinc oxide-rich outer area.

8. The substrate of claim 7 wherein the tin oxide-rich inner area is positioned directly over a first blocker layer, the first blocker layer being positioned directly over the first infrared-reflective layer.

9. The substrate of claim 7 wherein the zinc oxide-rich outer area comprises at least about 40 angstroms of essentially pure zinc oxide directly beneath the second infrared-reflective layer, the second infrared-reflective layer comprising silver.

10. The substrate of claim 1 wherein the concentration-modulated middle coat includes, in a contiguous sequence moving outwardly:
    i) a first high concentration area, the first high concentration area being rich in the first dielectric material;
    ii) the first graded film region;
    iii) a second high concentration area, the second high concentration area being rich in the second dielectric material;
    iv) a second graded film region having a substantially continuously decreasing concentration of the second dielectric material and a substantially continuously increasing concentration of a third dielectric material, wherein the second and third dielectric materials are different materials; and
    v) a third high concentration area, the third high concentration area being rich in the third dielectric material.

11. The substrate of claim 10 wherein the third dielectric material is zinc oxide, such that the third high concentration area is a zinc oxide-rich area.

12. The substrate of claim 11 wherein said zinc oxide-rich area comprises at least about 40 angstroms of essentially pure zinc oxide directly beneath the second infrared-reflective layer, the second infrared-reflective layer comprising silver.

13. The substrate of claim 10 wherein the first and third dielectric materials are both the same material, such that the first and third high concentration areas are both rich in the same material.

14. The substrate of claim 13 wherein the first and third dielectric materials are both zinc oxide, such that the first and third high concentration areas are both zinc oxide-rich areas.

15. The substrate of claim 14 wherein the second dielectric material is an oxide selected from the group consisting of tin oxide, zinc tin oxide, and titanium oxide.

16. The substrate of claim 10 wherein the first high concentration area comprises a first homogenous film region consisting essentially of the first dielectric material, the second high concentration area comprises a second homogenous film region consisting essentially of the second dielectric material, and the third high concentration area comprises a third homogenous film region consisting essentially of the third dielectric material.

17. The substrate of claim 16 wherein each homogenous film region has a thickness of less than 200 angstroms.

18. The substrate of claim 17 wherein the second homogenous film region has a thickness of less than about 180 angstroms.

19. The substrate of claim 1 wherein the concentration-modulated middle coat includes, in a contiguous sequence moving outwardly:
   i) a first high concentration area, the first high concentration area being rich in the first dielectric material;
   ii) the first graded film region;
   iii) a second high concentration area, the second high concentration area being rich in the second dielectric material;
   iv) a second graded film region having a substantially continuously decreasing concentration of the second dielectric material and a substantially continuously increasing concentration of a third dielectric material, wherein the second and third dielectric materials are different materials;
   v) a third high concentration area, the third high concentration area being rich in the third dielectric material;
   vi) a third graded film region having a substantially continuously decreasing concentration of the third dielectric material and a substantially continuously increasing concentration of a fourth dielectric material, wherein the third and fourth dielectric materials are different materials;
   vii) a fourth high concentration area, the fourth high concentration area being rich in the fourth dielectric material;
   viii) a fourth graded film region having a substantially continuously decreasing concentration of the fourth dielectric material and a substantially continuously increasing concentration of a fifth dielectric material, wherein the fourth and fifth dielectric materials are different materials; and
   ix) a fifth high concentration area, the fifth high concentration area being rich in the fifth dielectric material.

20. The substrate of claim 19 wherein the fifth dielectric material is zinc oxide, such that the fifth high concentration area is a zinc oxide-rich area.

21. The substrate of claim 20 wherein said zinc oxide-rich area comprises at least about 40 angstroms of essentially pure zinc oxide directly beneath the second infrared-reflective layer, the second infrared-reflective layer comprising silver.

22. The substrate of claim 19 wherein the first, third, and fifth dielectric materials are all the same material, such that the first, third, and fifth high concentration areas are all rich in the same material.

23. The substrate of claim 22 wherein the first, third, and fifth dielectric materials are all zinc oxide, such that the first, third, and fifth high concentration areas are all zinc oxide-rich areas.

24. The substrate of claim 19 wherein the second and fourth dielectric materials are both the same material, such that the second and fourth high concentration areas are both rich in the same material.

25. The substrate of claim 24 wherein the second and fourth dielectric materials are both an oxide selected from the group consisting of tin oxide, zinc tin oxide, and titanium oxide.

26. The substrate of claim 19 wherein the first high concentration area comprises a first homogenous film region consisting essentially of the first dielectric material, the second high concentration area comprises a second homogenous film region consisting essentially of the second dielectric material, the third high concentration area comprises a third homogenous film region consisting essentially of the third dielectric material, the fourth high concentration area comprises a fourth homogenous film region consisting essentially of the fourth dielectric material, and the fifth high concentration area comprises a fifth homogenous film region consisting essentially of the fifth dielectric material.

27. The substrate of claim 26 wherein each homogenous film region has a thickness of less than 200 angstroms.

28. The substrate of claim 27 wherein the second and fourth homogenous film regions each have a thickness of less than about 180 angstroms.

29. The substrate of claim 1 wherein the dielectric inner coat is a concentration-modulated inner coat including a second graded film region having a substantially continuously decreasing concentration of a third dielectric material and a substantially continuously increasing concentration of a fourth dielectric material, wherein the third and fourth dielectric materials are different materials.

30. The substrate of claim 29 wherein the dielectric outer coat is a concentration-modulated outer coat including a third graded film region having a substantially continuously decreasing concentration of a fifth dielectric material and a substantially continuously increasing concentration of a sixth dielectric material, wherein the fifth and sixth dielectric materials are different materials.

31. The substrate of claim 30 wherein the concentration-modulated inner, middle, and outer coats do not include any discrete interfaces between homogenous dielectric layers.

32. A substrate bearing a low-emissivity coating comprising, in sequence outwardly:
   a) a concentration-modulated inner coat including a first graded film region having a substantially continuously decreasing concentration of tin oxide and a substantially continuously increasing concentration of zinc oxide or zinc tin oxide or zinc aluminum oxide, wherein the first graded film region extends from a tin oxide-rich inner area to a zinc oxide-rich or zinc tin oxide-rich or zinc aluminum oxide-rich outer area, wherein the tin oxide-rich inner area of the first graded film region consists essentially of tin oxide;
   b) a first infrared-reflective layer comprising material that is highly reflective of solar radiation;
   c) a dielectric middle coat;
   d) a second infrared-reflective layer comprising material that is highly reflective of solar radiation; and
   e) a dielectric outer coat;
   wherein each infrared-reflective layer is substantially pure silver having discrete inner and outer interfaces with underlying and overlying films.

33. The substrate of claim 32 wherein the tin oxide-rich inner portion of the first graded film region is deposited directly over the substrate.

34. The substrate of claim 32 wherein the low-emissivity coating further includes a transparent base layer comprising silicon dioxide deposited directly over the substrate, the tin oxide-rich inner area of the first graded film region being deposited directly over the transparent base layer.

35. The substrate of claim 32 wherein the first infrared-reflective layer is deposited directly over the outer area of the first graded film region.

36. The substrate of claim 35 wherein the outer area of the first graded film region comprises at least about 40 angstroms of essentially pure zinc oxide directly beneath the first infrared-reflective layer, the first infrared-reflective layer comprising silver.

37. The substrate of claim 32 wherein the concentration-modulated inner coat includes, in a contiguous sequence moving outwardly:
   i) a first high concentration area, the first high concentration area being rich in tin oxide;
   ii) the first graded film region;
   iii) a second high concentration area, the second high concentration area being rich in zinc oxide or zinc tin oxide;
   iv) a second graded film region having a substantially continuously decreasing concentration of zinc oxide or zinc tin oxide and a substantially continuously increasing concentration of tin oxide;
   v) a third high concentration area, the third high concentration area being rich in tin oxide;
   vi) a third graded film region having a substantially continuously decreasing concentration of tin oxide and a substantially continuously increasing concentration of zinc oxide or zinc tin oxide; and
   vii) a fourth high concentration area, the fourth high concentration area being rich in zinc oxide or zinc tin oxide.

38. A substrate bearing a low-emissivity coating comprising, in sequence outwardly:
   a) a dielectric inner coat;
   b) a first infrared-reflective layer comprising material that is highly reflective of solar radiation;
   c) a concentration-modulated middle coat including, in a contiguous sequence moving outwardly:
      i) a first high concentration area, the first high concentration area being rich in a first dielectric material;
      ii) a first graded film region having a substantially continuously decreasing concentration of the first dielectric material and a substantially continuously increasing concentration of a second dielectric material, wherein the first and second dielectric materials are different materials and the second dielectric material is an oxide selected from the group consisting of tin oxide, zinc tin oxide, and titanium oxide;
      iii) a second high concentration area, the second high concentration area being rich in the second dielectric material;
      iv) a second graded film region having a substantially continuously decreasing concentration of the second dielectric material and a substantially continuously increasing concentration of a third dielectric material, wherein the second and third dielectric materials are different materials and the first and third dielectric materials are both zinc oxide, such that the first and third high concentration areas are both zinc oxide-rich areas; and
      v) a third high concentration area, the third high concentration area being rich in the third dielectric material;
   d) a second infrared-reflective layer comprising material that is highly reflective of solar radiation; and
   e) a dielectric outer coat.

39. A substrate bearing a low-emissivity coating comprising, in sequence outwardly:
   a) a dielectric inner coat;
   b) a first infrared-reflective layer comprising material that is highly reflective of solar radiation;
   c) a concentration-modulated middle coat including, in a contiguous sequence moving outwardly:
      i) a first high concentration area, the first high concentration area being rich in the first dielectric material;
      ii) a first graded film region having a substantially continuously decreasing concentration of a first dielectric material and a substantially continuously increasing concentration of a second dielectric material, wherein the first and second dielectric materials are different materials;
      iii) a second high concentration area, the second high concentration area being rich in the second dielectric material;
      iv) a second graded film region having a substantially continuously decreasing concentration of the second dielectric material and a substantially continuously increasing concentration of a third dielectric material, wherein the second and third dielectric materials are different materials;
      v) a third high concentration area, the third high concentration area being rich in the third dielectric material;
      vi) a third graded film region having a substantially continuously decreasing concentration of the third dielectric material and a substantially continuously increasing concentration of a fourth dielectric material, wherein the third and fourth dielectric materials are different materials and wherein the second and fourth dielectric materials are both an oxide selected from the group consisting of tin oxide, zinc tin oxide, and titanium oxide;
      vii) a fourth high concentration area, the fourth high concentration area being rich in the fourth dielectric material;
      viii) a fourth graded film region having a substantially continuously decreasing concentration of the fourth dielectric material and a substantially continuously increasing concentration of a fifth dielectric material, wherein the fourth and fifth dielectric materials are different materials; and
      ix) a fifth high concentration area, the fifth high concentration area being rich in the fifth dielectric material;
   d) a second infrared-reflective layer comprising material that is highly reflective of solar radiation; and
   e) a dielectric outer coat.

* * * * *